United States Patent
Nada

(10) Patent No.: US 10,008,604 B2
(45) Date of Patent: Jun. 26, 2018

(54) ACTIVE DEVICE AND METHOD FOR MANUFACTURING ACTIVE DEVICE

(71) Applicant: NISSHA PRINTING CO., LTD., Kyoto-shi, Kyoto (JP)

(72) Inventor: Hideaki Nada, Kyoto (JP)

(73) Assignee: NISSHA PRINTING CO., LTD., Kyoto (JP)

( * ) Notice: Subject to any disclaimer, the term of this patent is extended or adjusted under 35 U.S.C. 154(b) by 0 days. days.

(21) Appl. No.: 15/542,910

(22) PCT Filed: Aug. 4, 2016

(86) PCT No.: PCT/JP2016/072945
§ 371 (c)(1),
(2) Date: Jul. 11, 2017

(87) PCT Pub. No.: WO2017/038372
PCT Pub. Date: Mar. 9, 2017

(65) Prior Publication Data
US 2018/0090609 A1    Mar. 29, 2018

(30) Foreign Application Priority Data

Sep. 2, 2015  (JP) .................... 2015-173331

(51) Int. Cl.
*H01L 35/24* (2006.01)
*H01L 51/00* (2006.01)
(Continued)

(52) U.S. Cl.
CPC ........ *H01L 29/786* (2013.01); *H01L 51/0004* (2013.01); *H01L 51/102* (2013.01)

(58) Field of Classification Search
CPC .. H01L 29/786; H01L 51/0004; H01L 51/102
(Continued)

(56) References Cited

U.S. PATENT DOCUMENTS

| 2009/0146137 A1 | 6/2009 | Kim et al. |
| 2013/0050807 A1* | 2/2013 | Lee ............. G02B 26/005 |
| | | 359/316 |
| 2013/0334513 A1 | 12/2013 | Okumoto et al. |

FOREIGN PATENT DOCUMENTS

| JP | 2013-157525 | 8/2013 |
| TW | 201719882 A | 6/2017 |

(Continued)

OTHER PUBLICATIONS

International Search Report, dated Sep. 13, 2016 (Sep. 13, 2016), 2 pages.

*Primary Examiner* — David S Blum
(74) *Attorney, Agent, or Firm* — Rankin, Hill & Clark LLP

(57) ABSTRACT

[Object]
The present invention provides an active device in which the misalignment of a partition relative to electrodes is reduced and a method for manufacturing an active device.
[Solution]
An active device according to the present invention includes a substrate 2, a first electrode 5 and a second electrode 6 formed adjacent to each other on one main surface of the substrate 2, an organic semiconductor layer 9 formed on the one main surface of the substrate 2 at least over a region between the first electrode 5 and the second electrode 6, and a partition 12 formed on the one main surface of the substrate 2 in a region that is located outside the organic semiconductor layer 9 in a planar direction and that is different from regions where the first electrode 5 and the second electrode 6 are formed. The partition 12 is formed of a conductive material.

13 Claims, 9 Drawing Sheets

(51) Int. Cl.
*H01L 21/00* (2006.01)
*H01L 21/84* (2006.01)
*H01L 29/786* (2006.01)
*H01L 51/10* (2006.01)

(58) Field of Classification Search
USPC .......................................... 257/40; 438/158
See application file for complete search history.

(56) References Cited

FOREIGN PATENT DOCUMENTS

| | | |
|---|---|---|
| WO | 2008/120351 | 7/2010 |
| WO | 2013/008269 | 1/2013 |
| WO | 2013/073086 | 5/2013 |

\* cited by examiner

ACTIVE DEVICE AND METHOD FOR MANUFACTURING ACTIVE DEVICE

TECHNICAL FIELD

The present invention relates to active devices in which organic semiconductors are used for semiconductor layers.

BACKGROUND ART

Recently, with the increasing need for active devices such as those that are thinner, more flexible, lighter, and larger in area, polymer films such as polyethylene naphthalate (PEN) and polyimide (PI) films have been used as substrate materials. Accordingly, various active devices have been developed in which organic semiconductors, which can be deposited at temperatures not exceeding the maximum allowable temperatures of such films, are used for semiconductor layers. The deposition of organic semiconductors by printing can result in variations in the characteristics of the resulting devices since the manner in which an ink containing an organic semiconductor spreads directly affects the characteristics of the active devices. To control the spread of the ink, banks (partitions) are formed such that they surround the ink, for example, using a liquid-repellent insulating material containing a fluorinated component. Such banks are formed, for example, by photolithography or printing (see, for example, paragraphs 0028 and 0033 of PTL 1).

CITATION LIST

Patent Literature

PTL 1: International Publication No. 2008/120351

SUMMARY OF INVENTION

Technical Problem

Insulating materials containing fluorinated components, such as polytetrafluoroethylene (PTFE), are suitable as partition materials because of their low wettability to organic semiconductor inks. However, the step of forming partitions is required in addition to the step of forming electrodes. This tends to result in misalignment of partitions relative to electrodes. In particular, the misalignment of partitions relative to electrodes is more noticeable if films are used as substrates, since such substrates may change in size due to expansion or contraction after repeated thermal processes such as deposition and heat treatment. It is therefore necessary to make allowance for the misalignment of partitions relative to electrodes when designing the position and size of banks. This can lead to an increase in the size of active devices in the planar direction.

Accordingly, an object of the present invention is to provide an active device in which the spread of an organic semiconductor ink and the misalignment of a partition relative to electrodes are reduced and a method for manufacturing an active device.

Solution to Problem

An active device according to the present invention that can achieve the above object is summarized as follows. The active device includes a substrate, first and second electrodes formed adjacent to each other on one main surface of the substrate, an organic semiconductor layer formed on the one main surface of the substrate at least over a region between the first and second electrodes, and a partition formed on the one main surface of the substrate in a region that is located outside the organic semiconductor layer in a planar direction and that is different from regions where the first and second electrodes are formed. The partition is formed of a conductive material. Since the partition is formed of a conductive material in the active device according to the present invention, the partition can be formed together in the step of forming the electrodes, which eliminates the need for an additional step of providing the partition. In addition, according to the present invention, the misalignment of the partition relative to the first and second electrodes is reduced, so that the spread of the organic semiconductor ink can be easily controlled.

The partition preferably includes a plurality of partitions. The organic semiconductor layer is preferably formed between one partition and another partition. This allows the spread of the organic semiconductor ink to be blocked by taking into account various electrode patterns.

One side of the first electrode preferably located opposite one side of the second electrode. The one partition is preferably located opposite the other partition. A direction in which the one side of the first electrode is located opposite the one side of the second electrode is preferably perpendicular to a direction in which the one partition is located opposite the other partition. The first electrode, the second electrode, the one partition, and the other partition can block the spread of the organic semiconductor ink in four directions.

The conductive material for the partition is preferably Cu. Since Cu has a lower wettability than other conductive materials, the use of Cu as the material for the partition reduces the likelihood of the organic semiconductor layer spreading outward in the planar direction.

The active device preferably further includes an insulating layer formed on the organic semiconductor layer and a third electrode formed on the insulating layer. The partition preferably has a lower wettability than the substrate. This allows the organic semiconductor ink to be easily disposed inside the partition in the planar direction while spreading moderately over the substrate.

The active device preferably further includes a third electrode formed on the one main surface of the substrate and an insulating layer formed on the third electrode. The first and second electrodes and the organic semiconductor layer are preferably formed on the insulating layer. The partition preferably has a lower wettability than the insulating layer. This allows the organic semiconductor ink to be easily disposed inside the partition in the planar direction while spreading moderately over the insulating layer.

The active device preferably further includes a third electrode formed on another main surface of the substrate. The partition preferably has a lower wettability than the substrate. This allows the organic semiconductor ink to be easily disposed inside the partition in the planar direction while spreading moderately over the substrate.

The partition preferably has a lower wettability than the first and second electrodes. This reduces the likelihood of the organic semiconductor ink spreading outward beyond the partition in the planar direction.

The first electrode preferably includes a lower first electrode formed on the one main surface of the substrate and an upper first electrode formed on the lower first electrode. The second electrode preferably includes a lower second electrode formed on the one main surface of the substrate and an upper second electrode formed on the lower second electrode. The upper first electrode preferably has a lower wettability than the lower first electrode. The upper second electrode preferably has a lower wettability than the lower second electrode. If the electrodes disposed on the lower side have a higher wettability than the electrodes disposed on the upper side, the organic semiconductor ink comes into contact with the lower electrodes more readily than with the upper electrodes. A larger contact area between the electrodes and the organic semiconductor layer provides a higher efficiency of charge injection from the lower electrodes into the organic semiconductor layer or from the organic semiconductor layer into the lower electrodes, thus improving the operating speed of the device.

The partition is preferably formed to be higher in a thickness direction of the substrate than at least a portion of the first and second electrodes. This further reduces the likelihood of the organic semiconductor ink spreading outward beyond the partition in the planar direction.

A method for manufacturing an active device according to the present invention that can achieve the above object is summarized as follows. This method includes the steps of forming a first conductive layer on one main surface of a substrate; forming a second conductive layer on the first conductive layer; forming a mask layer on the second conductive layer; contacting the first and second conductive layers with an etchant to remove a region of the first and second conductive layers that is not covered by the mask layer, thereby forming first and second electrodes adjacent to each other on the one main surface of the substrate and forming a partition on the one main surface of the substrate a region that s different from regions where the first and second electrodes are formed and that is located outside a region between the first and second electrodes; and forming an organic semiconductor layer on the one main surface of the substrate at least over the region between the first and second electrodes. Since the partition is formed of a conductive material in the method for manufacturing an active device according to the present invention, the partition can be formed together in the step of forming the first and second electrodes, which eliminates the need for an additional step of providing the partition. In addition, according to the present invention, the misalignment of the partition relative to the first and second electrodes is reduced, so that the spread of the organic semiconductor ink can be easily controlled.

The method for manufacturing an active device according to the present invention preferably further includes, before forming the organic semiconductor layer, the steps of stripping the mask layer from the first and second electrodes and the partition; forming another mask layer on at least a portion of the second conductive layer that forms the partition; and contacting the first and second electrodes with another etchant to remove a region of the second conductive layer that is not covered by the other mask layer, thereby exposing at least a portion of the first and second electrodes. Since at least a portion of the first and second electrodes is exposed, the partition is formed to be higher in the thickness direction than at least a portion of the first and second electrodes. This further reduces the likelihood of the organic semiconductor ink spreading outward beyond the partition in the planar direction.

In the method for manufacturing an active device according to the present invention, a material for the first conductive layer is preferably ITO, and a material for the second conductive layer is preferably Cu. ITO has a low energy barrier with the organic semiconductor layer, thus providing a high efficiency of carrier injection into the organic semiconductor layer. Cu has high conductivity, thus contributing to improved operating speed of the active device. Cu is also inexpensive, thus improving the productivity of the active device.

Advantageous Effects of Invention

Since the partition is formed of a conductive material in the active device and the method of manufacture thereof according to the present invention, the partition can be formed together in the step of forming the electrodes, which eliminates the need for an additional step of providing the partition. In addition, according to the present invention, the misalignment of the partition relative to the first and second electrodes is reduced, so that the spread of the organic semiconductor ink can be easily controlled. Furthermore, according to the present invention, the misalignment of the partition relative to the electrodes is less likely to occur after repeated thermal processes such as deposition and heat treatment even if a film is used as the substrate.

DESCRIPTION OF EMBODIMENTS

Figure 1:
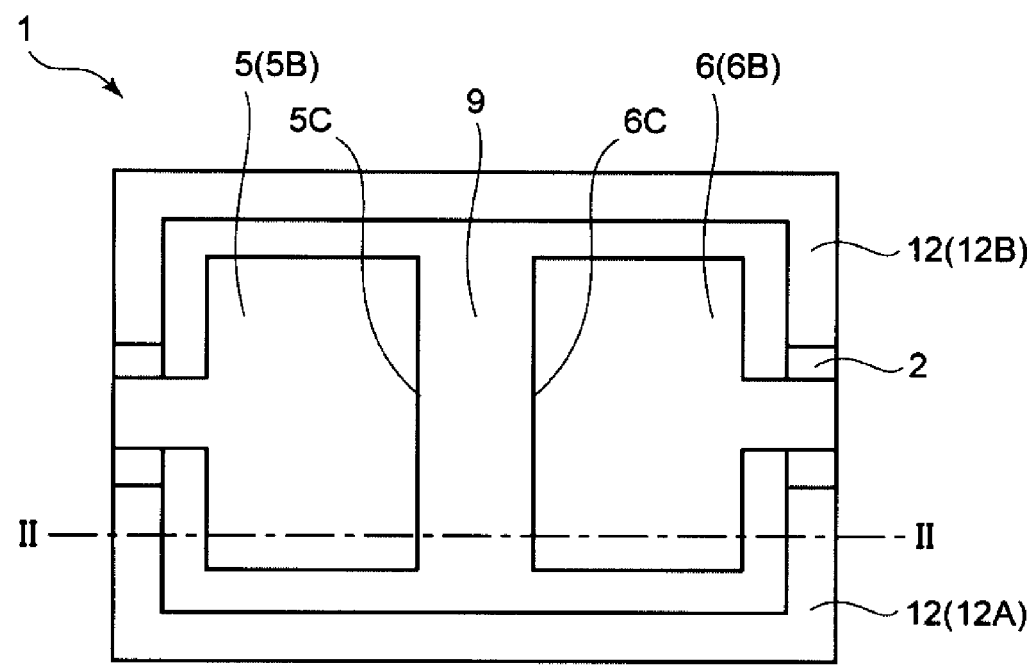
FIG. 1 illustrates a plan view of an active device according to the present invention.

The present invention will now be more specifically described based on embodiments. The following embodiments are not intended to limit the invention; rather, the invention may be practiced with modifications that fall within the spirit described above and below, and all such modifications are included in the technical scope of the invention. The various members in the drawings are not necessarily drawn to scale since the drawings are intended to facilitate a better understanding of the nature of the invention.

1. Active Device

An active device according to the present invention is a device for signal amplification or rectification, such as a transistor, thyristor, or diode. Example applications of such devices include displays, touch panels, solar cells, semiconductor lasers, pressure sensors, and biosensors.

The active device according to the present invention has a thickness direction and a planar direction. The thickness direction of the active device is the direction in which a substrate, first and second electrodes, and an organic semiconductor layer are stacked on top of each other, whereas the planar direction of the active device is the direction perpendicular to the thickness direction.

Figure 2:
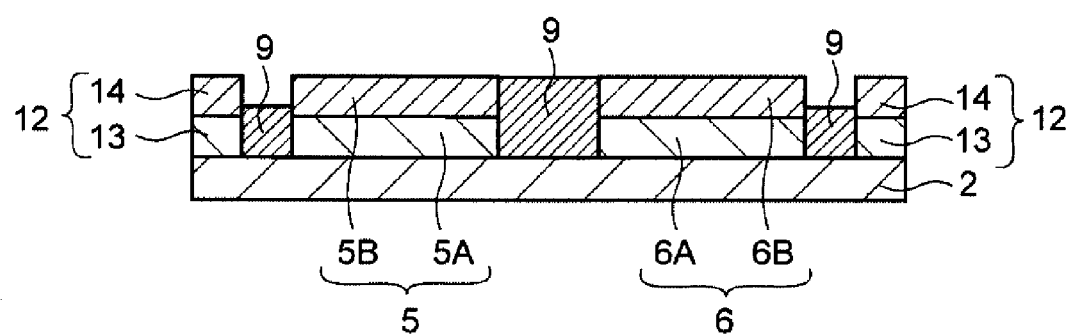
FIG. 2 illustrates a sectional view, taken along line II-II, of the active device shown in FIG. 1.

FIG. 1 illustrates a plan view of the active device according to the present invention, and FIG. 2 illustrates a sectional view, taken along line II-II, of the active device shown in FIG. 1. As shown in FIGS. 1 and 2, an active device 1 according to the present invention includes a substrate 2, a first electrode 5, a second electrode 6, an organic semiconductor layer 9, and partitions 12.

The substrate 2 has one main surface and another main surface and is provided to support the first electrode 5, the second electrode 6, and the organic semiconductor layer 9.

Preferred examples of substrates that may be used as the substrate 2 include flexible substrates formed of polymer films such as polyethylene naphthalate (PEN), polyethylene terephthalate (PET), and polyimide (PI) films and rigid substrates such as glass substrates.

The substrate 2 preferably has a thickness of, for example, 5 μm or more, more preferably 10 μm or more, even more preferably 18 μm or more, so that the substrate 2 does not fold or tear. The substrate 2, on the other hand, preferably has a thickness of 200 μm or less, more preferably 150 μm or less, even more preferably 125 μm or less, so that the active device 1 becomes thinner.

As described later, if the substrate 2 is a film that also functions as an insulating layer, the substrate 2 preferably has a thickness of 10 μm or less, more preferably 7 μm or less, even more preferably 5 μm or less, and preferably has a thickness of 0.1 μm or more, more preferably 0.5 μm or more, even more preferably 1 μm or more.

As shown in FIG. 1, the active device 1 according to the present invention includes the first electrode 5 and the second electrode 6, which are formed adjacent to each other on the one main surface of the substrate 2.

The first electrode 5, the second electrode 6, and a third electrode 11 described later (hereinafter also collectively referred to as "electrode") are electrically connected together so that the active device 1 can operate. For example, if the active device 1 is a transistor, the first electrode 5 corresponds to a source electrode, the second electrode 6 corresponds to a drain electrode, and the third electrode 11 corresponds to a gate electrode.

Examples of electrode materials that may be used include conductive materials such as Cu, Al, Ag, C, Ni, Au, ITO, ZnO, IGO, IGZO, carbon nanotubes, graphene, and graphite.

The electrodes may be formed by, for example, photolithography or printing. The formation of the first electrode 5 and the second electrode 6 by photolithography is preferred to improve the accuracy of the relative positions of the first electrode 5 and the second electrode 6.

The electrodes preferably have a thickness of, for example, 5 nm or more, more preferably 10 nm or more, even more preferably 20 nm or more, to provide the required conductivity. Although there is no particular upper limit to the thickness of the electrodes, the electrodes preferably have a thickness of, for example, 1 μm or less, more preferably 700 nm or less, even more preferably 500 nm or less, so that the entire active device 1 does not become thicker and that the etching time is shortened if photolithography is used.

The first and second electrodes are formed adjacent to each other, and one side of the first electrode may be located opposite one side of the second electrode. For example, in FIG. 1, one side 50 of the first electrode 5 is located opposite one side 6C of the second electrode.

Figure 3:
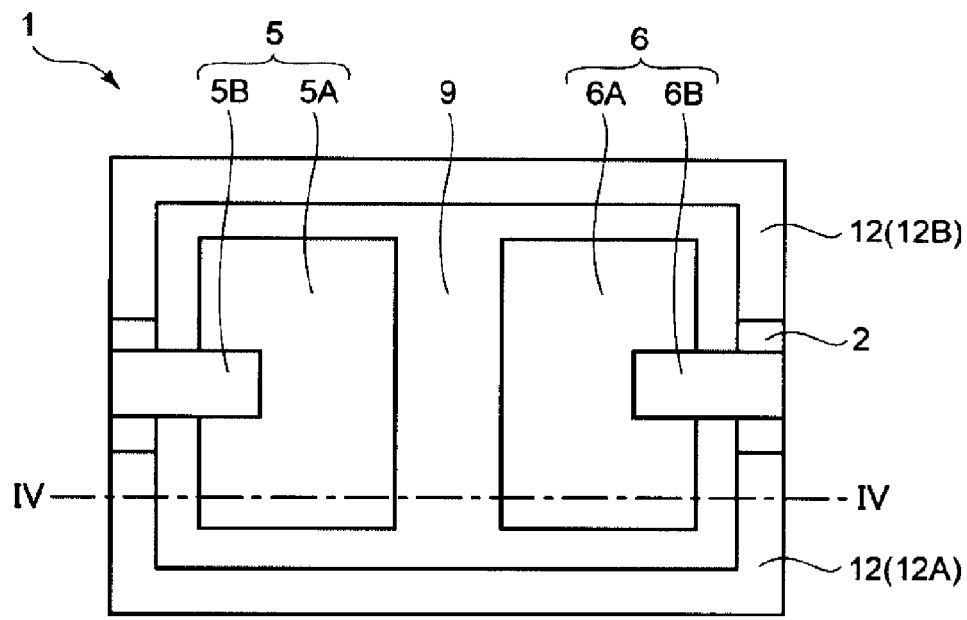
FIG. 3 illustrates a modification of a plan view of the active device according to the present invention.

As shown in FIGS. 2 and 3, the first electrode 5 and the second electrode 6 may be composed of a plurality of layers. Specifically, the first electrode 5 may include a lower first electrode 5A formed on the one main surface of the substrate 2 and an upper first electrode 5B formed on the lower first electrode 5A. As with the first electrode 5, the second electrode 6 may include a lower second electrode 6A formed on the one main surface of the substrate 2 and an upper second electrode 6B formed on the lower second electrode 6A. The performance of the active device 1 can be improved by selecting suitable materials for the electrodes disposed on the upper and lower sides.

The upper first electrode 5B preferably has a lower wettability than the lower first electrode 5A, and the upper second electrode 6B preferably has a lower wettability than the lower second electrode 6A. If the electrodes disposed on the lower side have a higher wettability than the electrodes disposed on the upper side, the organic semiconductor ink comes into contact with the lower electrodes more readily than with the upper electrodes. Depending on the magnitude of the energy barrier between the electrodes and the organic semiconductor layer 9, a larger contact area between the electrodes and the organic semiconductor layer 9 allows a larger proportion of charge to be injected from the lower electrodes into the organic semiconductor layer or from the organic semiconductor layer 9 into the lower electrodes (carrier injection efficiency), thus improving the operating speed of the device. The term "wettability" will be described later.

A preferred material used for the electrodes disposed on the lower side, i.e., the lower first electrode 5A and the lower second electrode 6A, is a material with high wettability to the organic semiconductor layer 9 and with high carrier injection efficiency, for example, ITO. On the other hand, the use of a material with high conductivity and mobility, for example, Cu, for the electrodes disposed on the upper side is preferred to improve the operating speed of the active device 1.

The upper first electrode 5B may have a larger area than the lower first electrode 5A (not shown). In this case, the use of a material with high conductivity and mobility for the upper first electrode 5B improves the operating speed of the active device 1. For the same reason, the upper second electrode 6B may have a larger area than the lower second electrode 6A (not shown).

Figure 4:
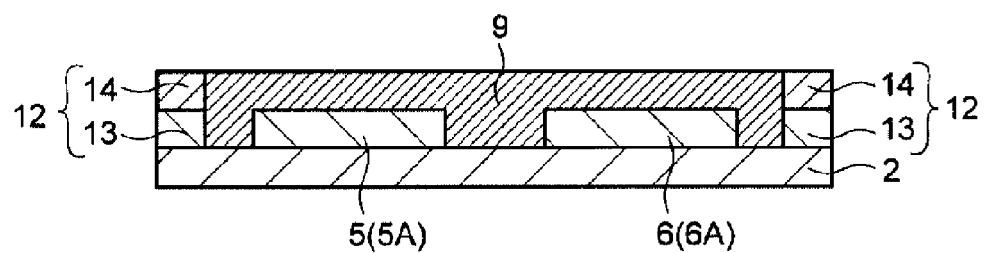
FIG. 4 illustrates a sectional view, taken along line IV-IV, of the active device shown in FIG. 3.

An example where the upper first electrode 5B has a smaller area than the lower first electrode 5A will next be described with reference to FIGS. 3 and 4. FIG. 3 illustrates a modification of a plan view of the active device shown in FIG. 1, and FIG. 4 illustrates a sectional view, taken along line IV-IV, of the active device in FIG. 3. As shown in FIGS. 3 and 4, the upper first electrode 5B may have a smaller area than the lower first electrode 5A. In this case, the selection of a material with high carrier injection efficiency as the material for the lower first electrode 5A allows for efficient carrier injection from the electrode into the organic semiconductor layer 9, thus improving the operating speed of the active device 1. In addition, the use of a material with high wettability to organic semiconductor inks as the material for the lower first electrode 5A increases the contact area between the lower first electrode 5A and the organic semiconductor layer 9, thus further improving the carrier injection efficiency. As shown in FIG. 3, the upper second electrode 6B may also have a smaller area than the lower second electrode 6A for the same reason as the first electrode 5.

For example, although there is no particular lower limit to the difference in electrode width between the lower first electrode 5A and the upper first electrode 5B, the difference in electrode width is preferably, for example, 1 μm or more, more preferably 3 μm or more, even more preferably 5 μm or more. On the other hand, although there is no particular upper limit to the difference in electrode width between the lower first electrode 5A and the upper first electrode 5B, the difference in electrode width is preferably, for example, 20 μm or less, more preferably 18 μm or less, even more preferably 15 μm or less. The difference in electrode width between the lower second electrode 6A and the upper second electrode 6B is also preferably set within the above range.

The first electrode 5 and the second electrode 6 may be separated from each other by any distance. For example, if the active device 1 is a transistor in which the first electrode 5 serves as a source electrode and the second electrode 6 serves as a drain electrode, the length between the first electrode 5 and the second electrode 6, i.e., the channel length, is preferably 20 μm or less, more preferably 15 μm or less, even more preferably 10 μm or less. Shorter channel lengths provide transistors with higher processing speeds and higher degrees of integration.

Figure 5:
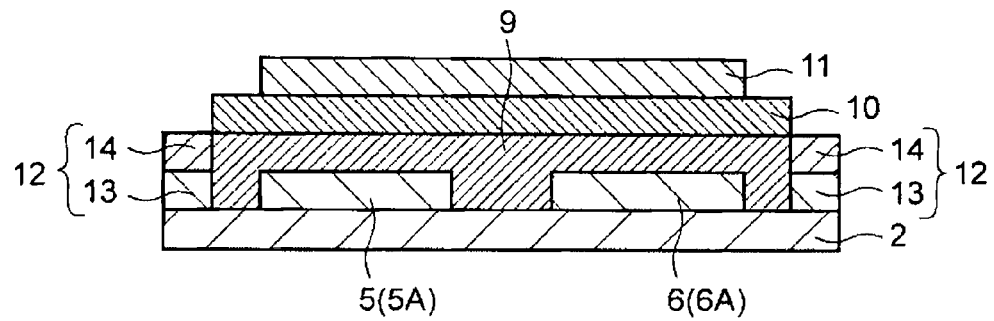
FIG. 5 illustrates a modification of a sectional view of the active device shown in FIG. 4.
Figure 6:
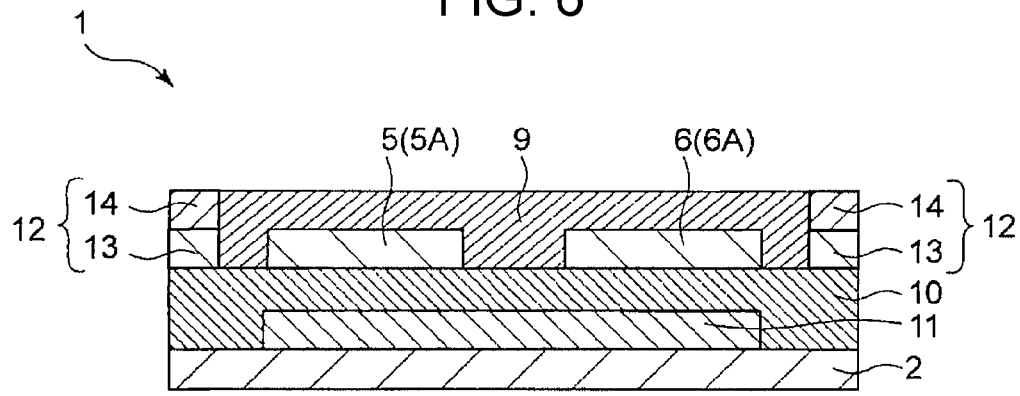
FIG. 6 illustrates a modification of a sectional view of the active device shown in FIG. 4.
Figure 7:
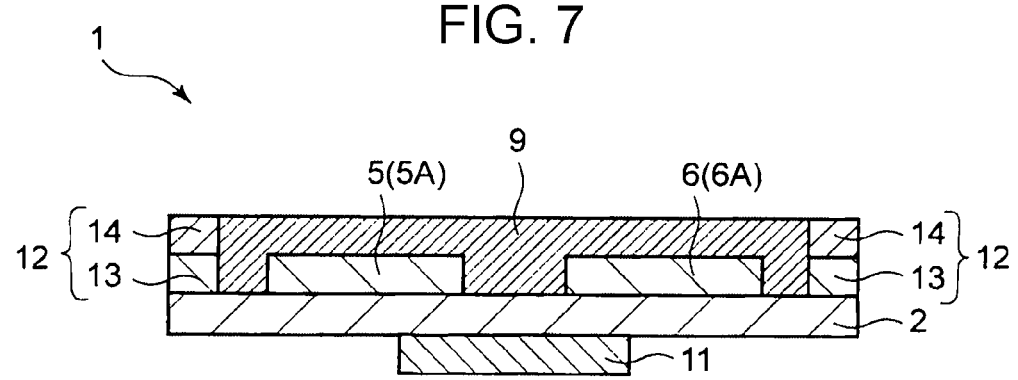
FIG. 7 illustrates a modification of a sectional view of the active device shown in FIG. 4.

FIGS. 5 to 7 illustrate modifications of sectional views of the active device shown in FIG. 4. As shown in FIG. 5, the active device 1 according to the present invention preferably includes an insulating layer 10 formed on the organic semiconductor layer 9 and a third electrode 11 formed on the insulating layer 10. In this case, if the first electrode 5 is used as a source electrode, the second electrode 6 is used as a drain electrode, and the third electrode 11 is used as a gate electrode, a top-gate-type transistor can be constructed in which the gate electrode is disposed above the source and drain electrodes.

As shown in FIG. 6, the active device 1 according to the present invention may include a third electrode 11 formed on the one main surface of the substrate 2 and an insulating layer 10 formed on the third electrode 11. In this case, if the first electrode 5 is used as a source electrode, the second electrode 6 is used as a drain electrode, and the third electrode 11 is used as a gate electrode, a bottom-gate-type transistor can be constructed in which the gate electrode is disposed below (closer to the substrate 2 than) the source and drain electrodes.

If the active device 1 is a transistor, the insulating layer 10 functions as a gate insulator. The insulating layer 10 is preferably formed of an insulating material such as $SiO_2$ or SiON.

To reduce leakage current, the insulating layer 10 preferably has a thickness of 200 nm or more, more preferably 250 nm or more, even more preferably 300 nm or more. On the other hand, to reduce the size of the active device 1, the insulating layer 10 preferably has a thickness of 600 nm or less, more preferably 550 nm or less, even more preferably 500 nm or less.

As shown in FIG. 7, the active device 1 according to the present invention may include a third electrode 11 formed on the other main surface of the substrate 2. In this case, if the first electrode 5 is used as a source electrode, the second electrode 6 is used as a drain electrode, and the third electrode 11 is used as a gate electrode, a transistor can be constructed in which the substrate 2 also functions as a gate insulator.

As shown in FIG. 2, the organic semiconductor layer 9 is formed on the one main surface of the substrate 2 at least over a region between the first electrode and the second electrode. If the active device 1 is a transistor, the organic semiconductor layer 9 functions as a channel region. Examples of materials that may be used for the organic semiconductor layer 9 include pentacene, anthracene, tetracene, rubrene, polyacetylene, polythiophene, fullerene, and carbon nanotubes.

Although there is no particular upper limit to the thickness of the organic semiconductor layer 9, the organic semiconductor layer 9 preferably has a thickness of, for example, 200 nm or less, more preferably 150 nm or less, even more preferably 100 nm or less, to provide a thinner active device 1.

The organic semiconductor layer 9 is preferably formed by printing. Specifically, the organic semiconductor layer 9 is formed by applying a liquid mixture of organic semiconductor molecules dispersed in an organic solvent for coating (hereinafter referred to as "organic semiconductor ink") to the substrate 2 and then drying the coating.

Examples of organic solvents that may be used to form the organic semiconductor layer 9 by printing include mesitylene, toluene, chloroform, p-diisopropylbenzene, benzyl alcohol, and mixtures thereof.

The partitions 12 are provided to control the spread of the organic semiconductor ink. As shown in FIG. 1, the partitions 12 are formed on the one main surface of the substrate 2 in a region that is located outside the organic semiconductor layer 9 in the planar direction and that is different from the regions where the first electrode 5 and the second electrode 6 are formed.

Although the partitions 12 may be formed at any position, as shown in FIG. 1, the partitions 12 are separated from the first electrode 5 and the second electrode 6 to insulate the partitions 12 from the first electrode 5 and the second electrode 6 so that the active device 1 has sufficient operating speed. Specifically, the partitions 12 are preferably disposed outside the first electrode 5 and the second electrode 6 in the planar direction of the substrate 2.

As shown in FIG. 1, the partitions 12 are preferably arranged to surround the organic semiconductor layer 9, excluding wiring lines, as completely as possible. This ensures that the partitions 12 block the spread of the organic semiconductor ink.

In FIG. 1, for the first electrode 5, the upper first electrode 5B and the upper second electrode 6B are disposed outside the lower first electrode 5A and the lower second electrode 6A, respectively. Accordingly, the partitions 12 are arranged to surround the organic semiconductor layer 9 without contact with the first electrode 5 or the second electrode 6.

The plan view in FIG. 1 shows two U-shaped partitions 12. However, as shown in the plan view in FIG. 8, the partitions 12A and 12B may be provided as parallel stripes on the upper and lower sides of the channel region formed by the first electrode 5 and the second electrode 6 to simplify the pattern of the partitions 12.

At least one partition 12 is provided, and a plurality of partitions 12 may also be provided. To block the spread of the organic semiconductor ink by taking into account various electrode patterns, as shown in FIGS. 1 and 3, a plurality of partitions 12 are preferably formed, and the organic semiconductor layer 9 is preferably formed between one partition 12A and another partition 12B. In FIGS. 1 and 3, the first electrode 5 and the second electrode 6 are formed to protrude outward in the planar direction (to the left of the first electrode 5 and to the right of the second electrode 6). These protrusions are connected to wiring lines (not shown). This allows the partitions 12A and 12B to block the spread of the organic semiconductor ink in the region other than the portions of the first electrode 5 and the second electrode 6 protruding outward in the planar direction.

If a plurality of partitions 12 are formed, there may be any positional relationship between the one partition 12A and the other partition 12B. For example, the one partition 12A and the other partition 12B may be arranged opposite each other.

Figure 8:
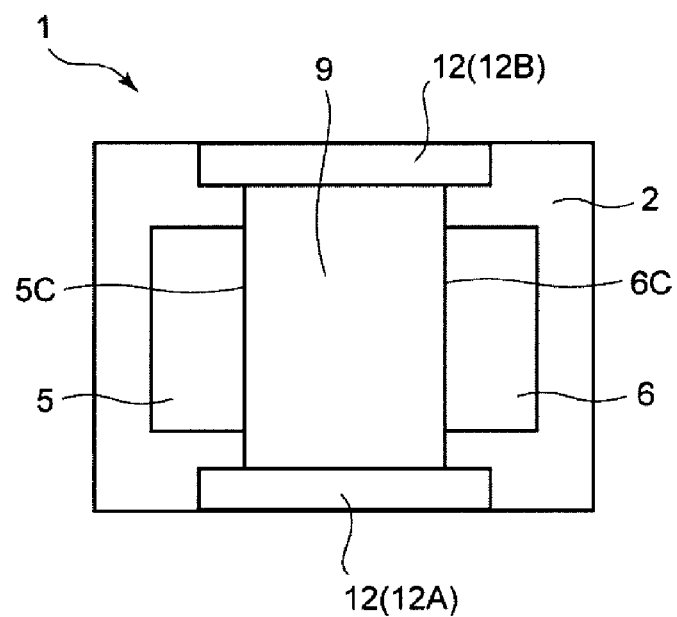
FIG. 8 illustrates a modification of a plan view of the active device shown in FIG. 1.

As shown in FIG. 8, one side 5C of the first electrode 5 is preferably located opposite one side 6C of the second electrode 6. The one partition 12A is preferably located opposite the other partition 12B. A direction in which the one side 5C of the first electrode 5 is located opposite the one side 6C of the second electrode 6 is preferably perpendicular to a direction in which the one partition 12A is located opposite the other partition 12B. These four components, i.e., the first electrode 5, the second electrode 6, the one partition 12A, and the other partition 12B, can block the spread of the organic semiconductor ink in four directions.

As shown in FIG. 8, the partitions 12 may be formed inside the first electrode 5 and the second electrode 6 in the left-right direction to reduce the size of the active device 1 in the planar direction.

The partitions 12 are formed of a conductive material. Conventionally, if an insulating material is used as the material for the partitions 12, the step of providing the partitions 12 is required in addition to the step of forming the electrodes. In contrast, since the partitions 12 are formed of a conductive material in the present invention, the partitions 12 can be formed together in the step of forming the electrodes, which eliminates the need for an additional step of providing the partitions 12. In addition, according to the present invention, the misalignment of the partitions 12 relative to the first electrode 5 and the second electrode 6 is reduced, so that the spread of the organic semiconductor ink can be easily controlled.

Examples of conductive materials for the partitions 12 include Cu, Al, Ag, C, Ni, Au, ITO, ZnO, IGO, IGZO, carbon nanotubes, graphene, and graphite.

A preferred conductive material for the partitions 12 is Cu. The verification described later demonstrates that Cu has a significantly lower wettability than other conductive materials (Au, ITO, and IGZO); therefore, the use of Cu as the material for the partitions 12 reduces the likelihood of the organic semiconductor layer 9 spreading excessively outward in the planar direction.

In the present invention, the wettability of the partitions 12 refers to the wettability of the partitions 12 to the organic semiconductor ink for forming the organic semiconductor layer 9. As the wettability of the partitions 12 becomes higher, the organic semiconductor ink spreads more easily over the partitions 12 in the planar direction. Similarly, the wettability of the substrate 2 refers to the wettability of the substrate 2 to the organic semiconductor ink for forming the organic semiconductor layer 9, and the wettability of the electrodes refers to the wettability of the electrodes to the organic semiconductor ink for forming the organic semiconductor layer 9.

Specifically, wettability can be evaluated from the following measures.

(1) Contact Angle

Contact angle, which is the angle made by liquid and solid surfaces, is measured in accordance with JIS R 3257:1999 Testing Method of wettability of Glass Substrate. Although it is desirable to directly measure the contact angle of the liquid organic semiconductor ink, the contact angle of water may instead be measured for simple wettability evaluation on the assumption that the contact angle of the organic semiconductor ink is proportional to that of water.

The partitions 12 preferably have a contact angle of 70° or more, more preferably 90° or more, even more preferably 110° or more, with the organic semiconductor ink to reduce the likelihood of the organic semiconductor ink spreading excessively over the partitions 12 in the planar direction.

(2) Surface Free Energy

Surface free energy γS (unit: N/m), which is a numerical representation of the intermolecular force of a solid surface, may also be used as a measure of wettability. Surface free energy can be calculated from the contact angle and the surface tension of the liquid used for measurement by extended Fowkes' equation (1) and Young's equation (2) below. The liquid used for contact angle measurement may be selected from pure water, liquid paraffin, glycerol, methylene iodide, n-hexadecane, α-bromonaphthalene, and other liquids.

$$\gamma L(1+\cos\theta)/2 = (\gamma Sd \times \gamma Ld)^{1/2} + (\gamma Sp \times \gamma Lp)^{1/2} + (\gamma Sh \times \gamma Lh) \quad (1)$$

$$\gamma S = \gamma Sd + \gamma Sp + \gamma Sh \quad (2)$$

γL: surface tension of liquid used for measurement
γLd: dispersive component of surface tension of liquid used for measurement
γLp: polar component of surface tension of liquid used for measurement γLh: hydrogen bond component of surface tension of liquid used for measurement
  γS: surface free energy
  γSd: dispersive component of surface free energy
  γSp: polar component of surface free energy
  γSh: hydrogen bond component of surface free energy As the surface free energy of the partitions 12 becomes lower, the adhesion of the organic semiconductor ink to the partitions 12 becomes lower, and accordingly, the organic semiconductor ink spreads less easily in the planar direction. Thus, the partitions 12 preferably have a lower surface free energy.

As shown in FIG. 5, if the active device 1 includes an insulating layer 10 formed on the organic semiconductor layer 9 and a third electrode 11 formed on the insulating layer 10, it is desirable that the organic semiconductor ink forming the organic semiconductor layer 9 be disposed inside the partitions 12 in the planar direction while spreading moderately over the substrate 2. Accordingly, the partitions 12 preferably have a lower wettability than the substrate 2.

On the other hand, as shown in FIG. 6, if the active device 1 includes a third electrode 11 formed on the one main surface of the substrate 2 and an insulating layer 10 formed on the third electrode 11, and the first electrode 5, the second electrode 6, and the organic semiconductor layer 9 are formed on the insulating layer 10, it is desirable that the organic semiconductor ink forming the organic semiconductor layer 9 be disposed inside the partitions 12 in the planar direction while spreading moderately over the insulating layer 10. Accordingly, the partitions 12 preferably have a lower wettability than the insulating layer 10.

As shown in FIG. 7, if the active device 1 includes a third electrode 11 formed on the other main surface of the substrate 2, it is desirable that the organic semiconductor ink forming the organic semiconductor layer 9 be disposed inside the partitions 12 in the planar direction while spreading moderately over the substrate 2. Accordingly, the partitions 12 preferably have a lower wettability than the substrate 2.

The partitions 12 preferably have a lower wettability than the first electrode 5 and the second electrode 6. This reduces the likelihood of the organic semiconductor ink spreading outward beyond the partitions 12 in the planar direction.

As shown in FIG. 2, the partitions 12 may be composed of a plurality of conductive materials stacked on top of each other. Specifically, the partitions 12 may be a stack of a lower partition 13 formed on the main surface of the substrate 2 and an upper partition 14 formed on the lower partition 13. For example, if the partitions 12 are formed together with the electrodes by stacking a plurality of conductive materials on top of each other, the partitions 12 have the same layered structure as the electrodes. In this case, the upper partition 14 preferably has a lower wettability to the organic semiconductor ink than the lower partition 13. This reduces the likelihood of the organic semiconductor ink spreading outward beyond the upper partition 14 in the planar direction.

The partitions 12 are preferably formed to be higher in the thickness direction of the substrate than at least a portion of the first electrode 5 and the second electrode 6. This further reduces the likelihood of the organic semiconductor ink spreading outward beyond the partitions 12 in the planar direction.

Although there is no particular lower limit to the height of the partitions 12 in the thickness direction, the height of the partitions 12 is preferably, for example, 1.2 times or more, more preferably 1.5 times or more, even more preferably 1.8 times or more, the height of the first electrode 5 and the second electrode 6.

2. Method for Manufacturing Active Device

FIGS. 9 to 19 illustrate process sectional views showing a method for manufacturing the active device according to the present invention.

The method for manufacturing the active device according to the present invention includes the steps of:
(1) forming a first conductive layer on one main surface of a substrate;
(2) forming a second conductive layer on the first conductive layer;
(3) forming a mask layer on the second conductive layer;
(4) contacting the first and second conductive layers with an etchant to remove a region of the first and second conductive layers that is not covered by the mask layer, thereby forming first and second electrodes adjacent to each other on the one main surface of the substrate and forming a partition on the one main surface of the substrate in a region that is different from regions where the first and second electrodes are formed and that is located outside a region between the first and second electrodes; and
(8) forming an organic semiconductor layer on the one main surface of the substrate at least over the region between the first and second electrodes.

To improve the performance of the active device 1, the method for manufacturing the active device 1 according to the present invention may include, before the step (8) of forming the organic semiconductor layer, the steps of:
(5) stripping the mask layer from the first and second electrodes and the partition;
(6) forming another mask layer on at least a portion of the second conductive layer that forms the partition; and
(7) contacting the first and second electrodes with another etchant to remove a region of the second conductive layer that is not covered by the other mask layer, thereby exposing at least a portion of the first and second electrodes.

By performing Steps (6) and (7), the size of the upper first electrode 5B can be adjusted relative to that of the lower first electrode 5A, and the size of the upper second electrode 6B can be adjusted relative to that of the lower second electrode 6A. The individual steps will now be described in detail.

(1) Step of Forming First Conductive Layer on One Main Surface of Substrate

Figure 9:
FIG. 9 illustrates a process sectional view showing a method for manufacturing the active device according to the present invention.

As shown in FIG. 9, the substrate 2 is provided. Although not shown, an adhesion layer, a planarizing layer, and an optical matching layer, for example, may be formed on a main surface of the substrate 2. Through-holes (not shown) for forming terminal electrodes and via electrodes may also be formed through the substrate 2 in the thickness direction. The through-holes may be formed by techniques such as puncture with pointed instruments, punching, and laser processing.

Figure 10:
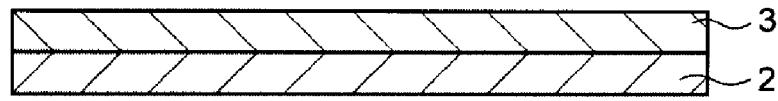
FIG. 10 illustrates a process sectional view showing the method for manufacturing the active device according to the present invention.

As shown in FIG. 10, a first conductive layer 3 is formed on one main surface of the substrate 2. The first conductive layer 3 is provided to form various electrodes such as source, drain, and gate electrodes, terminal electrodes, and via electrodes.

The first conductive layer 3 may be formed by any process. For example, the first conductive layer 3 may be formed by vacuum evaporation or sputtering. If no through-hole is formed through the substrate 2 in the thickness direction, the first conductive layer 3 may be formed by laminating a foil of a conductive material.

(2) Step of Forming Second Conductive Layer on First Conductive Layer

Figure 11:
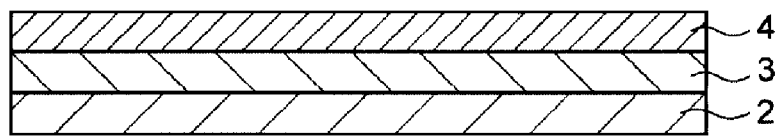
FIG. 11 illustrates a process sectional view showing the method for manufacturing the active device according to the present invention.

As shown in FIG. 11, a second conductive layer 4 is formed on the first conductive layer 3. As with the first conductive layer 3, the second conductive layer 4 is provided to form various electrodes such as source, drain, and gate electrodes, terminal electrodes, and via electrodes.

The second conductive layer 4 may be formed by any process. For example, as with the first conductive layer 3, the second conductive layer 4 may be formed by vacuum evaporation or sputtering. If no through-hole is formed through the substrate 2 in the thickness direction, the second conductive layer 4 may be formed by laminating a foil of a conductive material.

Examples of materials that may be used for the first conductive layer 3 and the second conductive layer 4 include conductive materials such as Cu, Al, Ag, C, Ni, Au, ITO, ZnO, IGO, IGZO, carbon nanotubes, graphene, and graphite. In particular, a preferred material for the first conductive layer 3 is ITO. ITO has a low energy barrier with the organic semiconductor layer 9, thus providing a high efficiency of carrier injection into the organic semiconductor layer 9. On the other hand, a preferred material for the second conductive layer 4 is Cu. Cu has high conductivity, thus contributing to improved operating speed of the active device 1. Cu is also inexpensive, thus improving the productivity of the active device 1.

(3) Step of Forming Mask Layer on Second Conductive Layer

Figure 12:
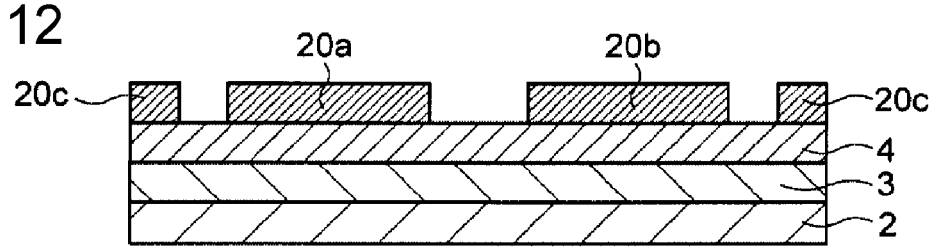
FIG. 12 illustrates a process sectional view showing the method for manufacturing the active device according to the present invention.

As shown in FIG. 12, mask layers 20a, 20b, and 20c are formed on the second conductive layer 4. The mask layers 20a, 20b, and 20c determine the positions where the first electrode 5, the second electrode 6, and the partitions 12, respectively, are formed.

A specific method for forming the mask layers is as follows. A photosensitive resin composition such as a dry film resist or a liquid resist (containing a photosensitive resin and other ingredients such as a curing agent and a solvent, hereinafter simply referred to as "photosensitive resin") is applied to the second conductive layer 4. Photosensitive resins include negative photosensitive resins, which become insoluble in a developer in an exposed area, and positive photosensitive resins, which become soluble in a developer in an exposed area. A negative photosensitive resin is described herein by way of example. The resist is applied to the second conductive layer 4 and is irradiated with an electron beam or light (ultraviolet radiation) to form a predetermined circuit pattern on the resist. The pattern formed on the resist includes the pattern of the first electrode 5 and the second electrode 6 (e.g., source and drain electrodes for transistors) and the pattern of the partitions 12.

The circuit pattern is transferred and printed on the resist by exposure with an exposure system (not shown) on the one main surface of the substrate 2.

The resist is contacted with a developer to dissolve any unexposed portion of the resist in the developer. As a result, as shown in FIG. 12, the exposed portions of the resist remain as the mask layers 20a, 20b, and 20c on the second conductive layer 4.

Although the mask layers may be formed using a dry resist film or a liquid resist, the mask layers are preferably formed using a dry resist film. The formation of the mask layers using a dry resist film provides a higher productivity than the formation of the mask layers using a liquid resist since it is not necessary to remove any solvent by drying after the application of the resist.

Figure 13:
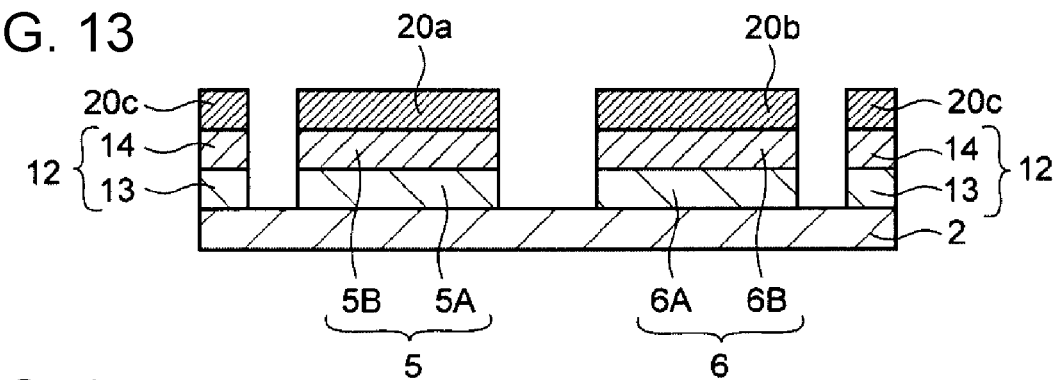
FIG. 13 illustrates a process sectional view showing the method for manufacturing the active device according to the present invention.

(4) Step of Contacting First and Second Conductive Layers with Etchant to Remove Region of First and Second Conductive Layers that is not Covered by Mask Layer, Thereby Forming First and Second Electrodes Adjacent to Each Other on One Main Surface of Substrate and Forming Partition on One Main Surface of Substrate in Region that is Different from Regions where First and Second Electrodes are Formed and that is Located Outside Region Between First and Second Electrodes The first conductive layer 3 and the second conductive layer 4 are contacted with an etchant. As shown in FIG. 13, this procedure removes the region of the first conductive layer 3 and the second conductive layer 4 that is not covered by the mask layers.

Thus, since the partitions 12 are formed of a conductive material in the present invention, the partitions 12 can be formed together in the step of forming the first electrode 5 and the second electrode 6, which eliminates the need for an additional step of providing the partitions. In addition, according to the present invention, the misalignment of the partitions 12 relative to the first electrode 5 and the second electrode 6 is reduced, so that the spread of the organic semiconductor ink can be easily controlled.

(5) Step of Stripping Mask Layer from First and Second Electrodes and Partition

Figure 14:
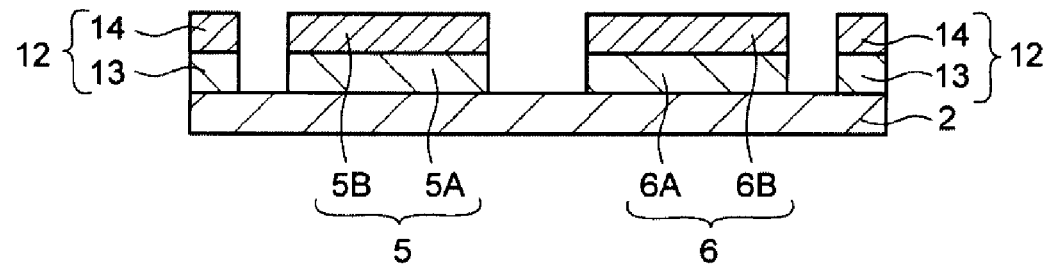
FIG. 14 illustrates a process sectional view showing the method for manufacturing the active device according to the present invention.

The mask layers formed on the first electrode 5, the second electrode 6, and the partitions 12 are contacted with and dissolved in a stripping solution to strip the mask layers from the first electrode 5, the second electrode 6, and the partitions 12. As a result, as shown in FIG. 14, the first electrode 5, the second electrode 6, and the partitions 12 are formed on the one main surface of the substrate 2. The first electrode 5 and the second electrode 6 are formed adjacent to each other. The partitions 12 are formed in regions that are different from the regions where the first electrode 5 and the second electrode 6 are formed and that are located outside the region between the first electrode 5 and the second electrode 6. Since the second conductive layer 4 is formed on the first conductive layer 3, the first electrode 5 includes the lower first electrode 5A, which is formed from the first conductive layer 3, and the upper first electrode 5B, which is formed from the second conductive layer 4. As with the first electrode 5, the second electrode 6 includes the lower second electrode 6A, which is formed from the second conductive layer 4, and the upper second electrode 6B.

Figure 15:
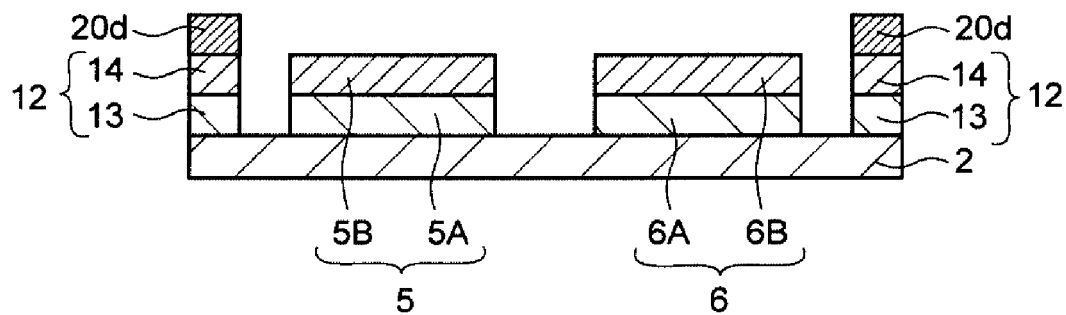
FIG. 15 illustrates a process sectional view showing the method for manufacturing the active device according to the present invention.

(6) Step of Forming Another Mask Layer on at Least Portion of Second Conductive Layer that Forms Partition As shown in FIG. 15, another mask layer 20d may be formed on at least the portions of the second conductive layer 4 that form the partitions 12 to prevent the partitions 12 from being etched. The method for forming the other mask layer is similar to the method for forming the mask layers 20a, 20b, and 20c described above.

Figure 16:
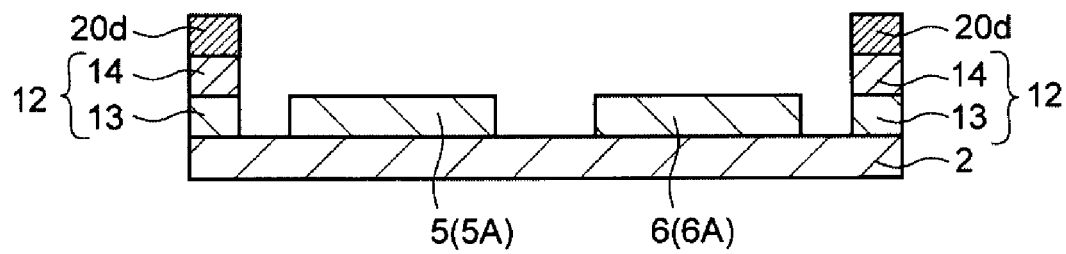
FIG. 16 illustrates a process sectional view showing the method for manufacturing the active device according to the present invention.

(7) Step of Contacting First and Second Electrodes with Another Etchant to Remove Region of Second Conductive Layer that is not Covered by Other Mask Layer, Thereby Exposing at Least Portion of First and Second Electrodes As shown in FIG. 16, the first electrode 5 and the second electrode 6 may be contacted with another etchant to remove a region of the second conductive layer 4 that is not covered by the other mask layer, thereby exposing at least a portion of the first electrode and the second electrode. Specifically, the first electrode 5 and the second electrode 6 may be contacted with another etchant to remove the upper first electrode 5B and the upper second electrode 6B. The other etchant used in this step may be selected from etchants that remove the second conductive layer 4 but do not remove the first conductive layer 3.

Figure 17:
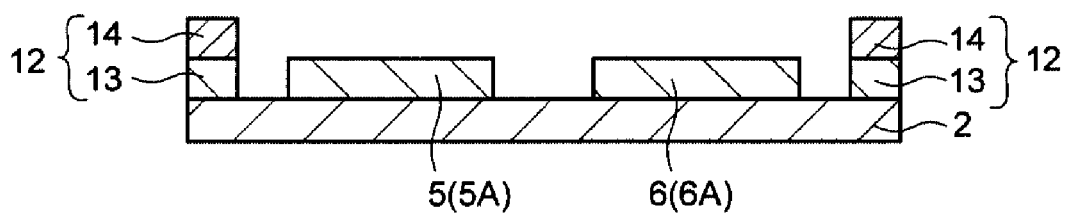
FIG. 17 illustrates a process sectional view showing the method for manufacturing the active device according to the present invention.

As shown in FIG. 17, the other mask layer 20d is contacted with and dissolved in a striping solution to remove the other mask layer 20d. As compared to FIG. 14, the partitions 12 are formed to be higher in the thickness direction than at least a portion of the first electrode 5 and the second electrode 6. This further reduces the likelihood of the organic semiconductor ink spreading outward beyond the partitions 12 in the planar direction in the step (5) of forming the organic semiconductor layer 9.

Figure 18:
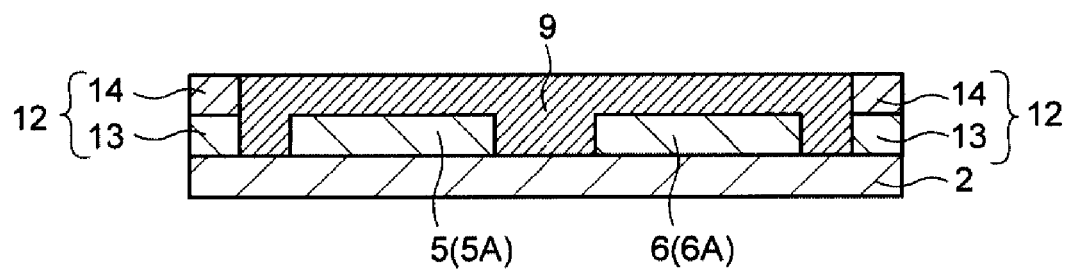
FIG. 18 illustrates a process sectional view showing the method for manufacturing the active device according to the present invention.

(8) Step of Forming Organic Semiconductor Layer on One Main Surface of Substrate at Least Over Region Between First and Second Electrodes The organic semiconductor layer 9 is formed on the one main surface of the substrate 2 at least over the region between the first electrode 5 and the second electrode 6. In this way, an active device 1 can be manufactured in which the organic semiconductor layer 9 is formed on the one main surface of the substrate 2 from which the first conductive layer 3 and the second conductive layer 4 have been removed. If steps (6) and (7) are not performed, the active device 1 shown in FIG. 2 is obtained; if steps (6) and (7) are performed, the active device 1 shown in FIG. 18 is obtained.

To obtain a top-gate-type transistor, step (8) may be followed by step (9) below.

(9) Step of Forming Insulating Layer 10 on Organic Semiconductor Layer 9 and Forming Third Electrode 11 on Insulating Layer 10

Figure 19:
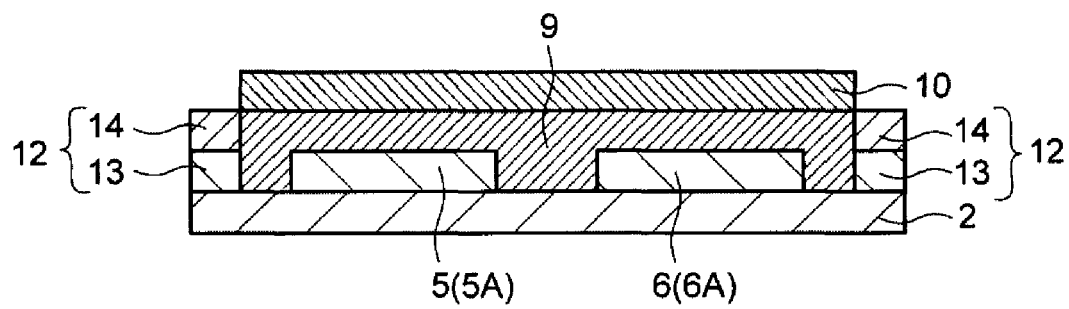
FIG. 19 illustrates a process sectional view showing the method for manufacturing the active device according to the present invention.

As shown in FIG. 19, the insulating layer 10 is formed on the organic semiconductor layer 9. As shown in FIG. 5, the third electrode 11 is then formed on the insulating layer 10. FIGS. 5 and 19 illustrate an example where steps (6) and (7) are performed.

Thus, by performing step (9), a top-gate-type transistor can be manufactured in which the first electrode 5, the second electrode 6, and the third electrode 11 correspond to a source electrode, a drain electrode, and a gate electrode, respectively.

To obtain a bottom-gate-type transistor, step (1) may be preceded by step (10) below.

(10) Step of Forming Third Electrode on One Main Surface of Substrate 2 and Forming Insulating Layer 10 on Third Electrode 11

The substrate 2 is provided, and the third electrode 11 is formed on one main surface of the substrate 2. The third electrode 11 may be formed by printing or photolithography. If photolithography is used, as in the formation of the first electrode 5 and the second electrode 6, the third electrode 11 is formed by forming a third conductive layer (not shown), forming a mask layer having the desired pattern on the third conductive layer, and contacting the third conductive layer with an etchant.

The insulating layer 10 is then formed on the third electrode 11.

By performing step (10), as shown in FIG. 6, a bottom-gate-type transistor can be manufactured in which the first electrode 5, the second electrode 6, and the third electrode 11 correspond to a source electrode, a drain electrode, and a gate electrode, respectively. FIG. 6 illustrates an example where steps (6) and (7) are performed.

Verification

Figure 20:
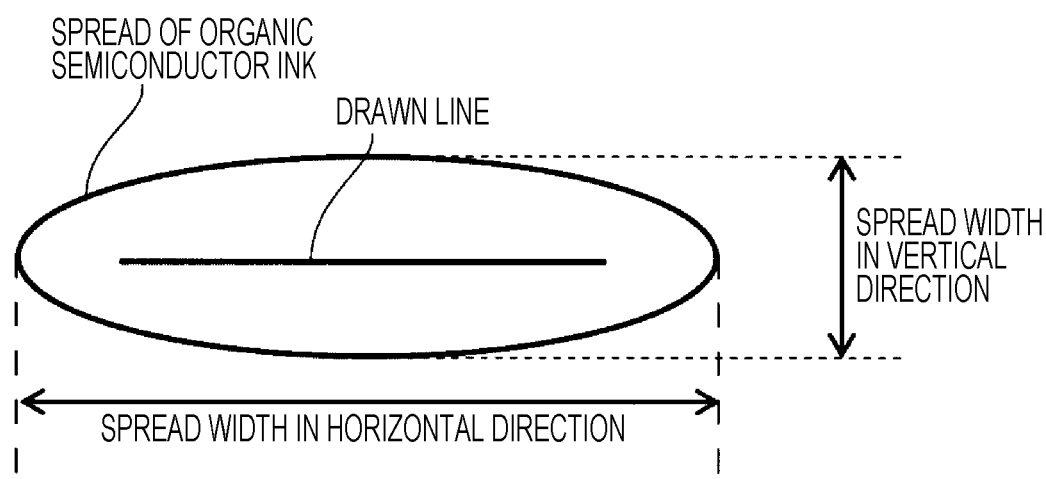
FIG. 20 illustrates a schematic view showing a method for evaluating the spread width of an organic semiconductor ink on conductive materials.
Figure 21:
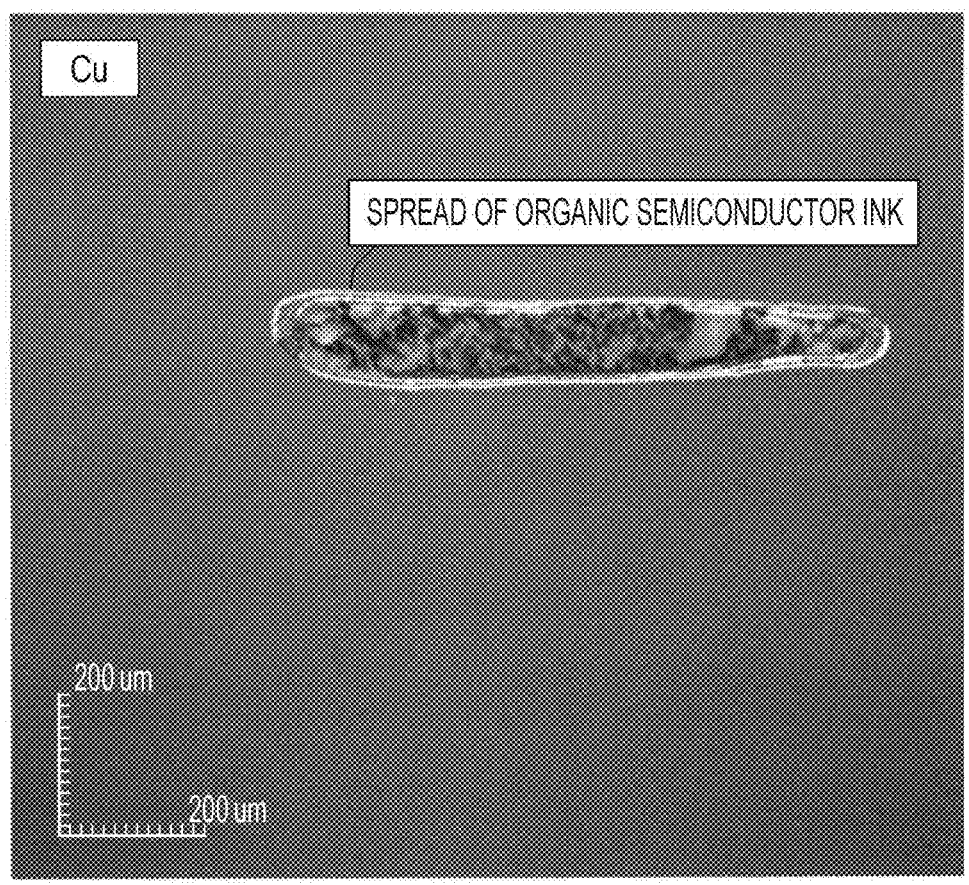
FIG. 21 illustrates a photograph showing the results of the spread of the organic semiconductor ink on Cu.
Figure 22:
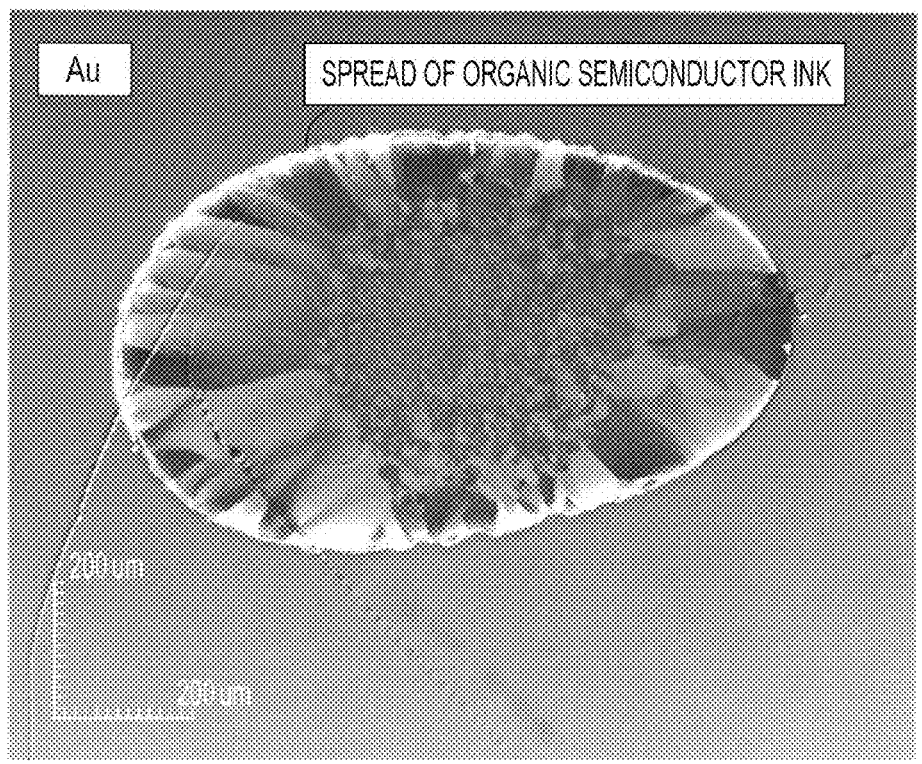
FIG. 22 illustrates a photograph showing the results of the spread of the organic semiconductor ink on Au.
Figure 23:
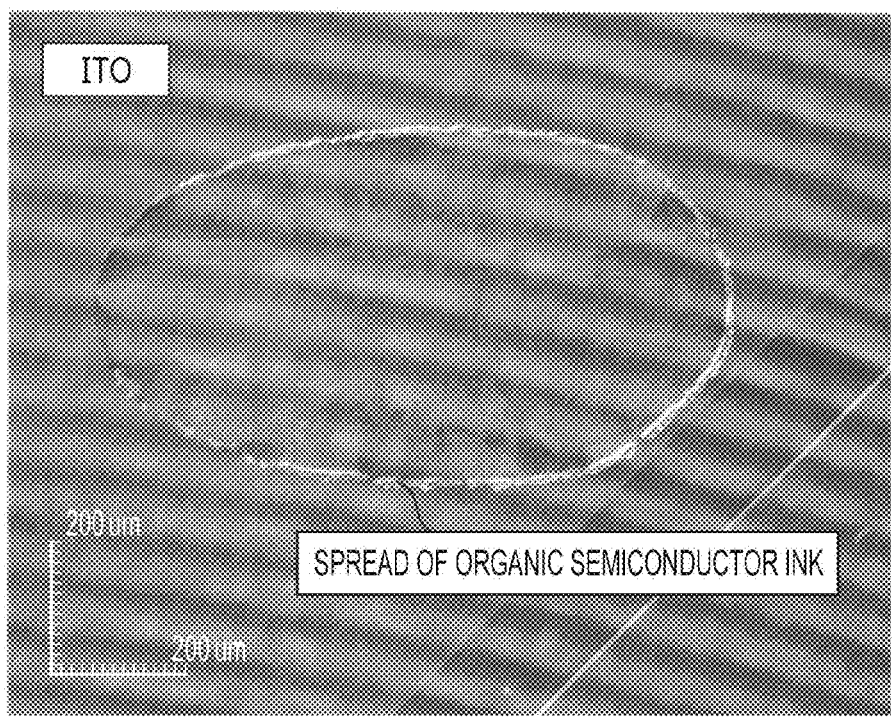
FIG. 23 illustrates a photograph showing the results of the spread of the organic semiconductor ink on ITO.
Figure 24:
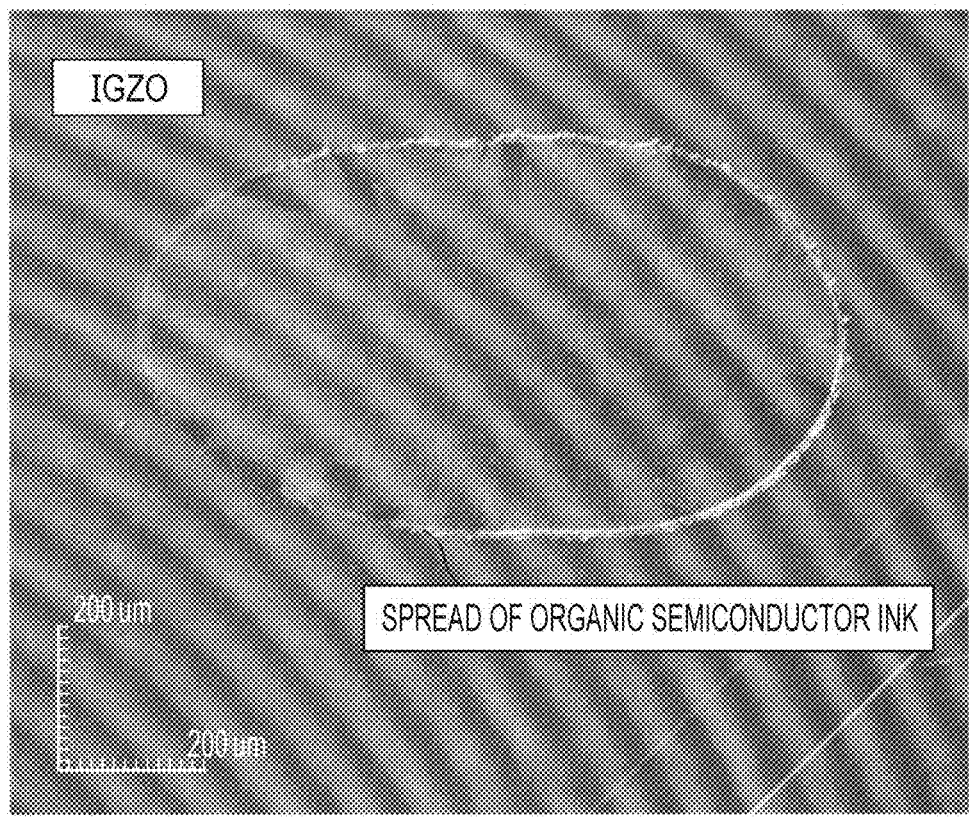
FIG. 24 illustrates a photograph showing the results of the spread of the organic semiconductor ink on IGZO.

As shown in FIG. 20, a line with a length of 750 μm was printed with an organic semiconductor ink on conductive materials, i.e., Cu, Au, ITO, and IGZO, having vertical and horizontal directions using the following printer. After the organic semiconductor ink stopped spreading, the spread widths of the organic semiconductor ink in the vertical and horizontal directions were measured three times for each material. Table 1 shows the measurements of the spread width (unit: μm) of the ink in the vertical and horizontal directions and the average of the three measurements (unit: μm). FIGS. 21, 22, 23, and 24 show how the ink spread on the conductive materials, i.e., Cu, Au, ITO, and IGZO, respectively.

Drawing Conditions
Printer: ink-jet (Dimatix (registered trademark) DMP-2831) from Fujifilm Corporation
Organic semiconductor ink:
organic semiconductor: 2 wt % dif-TES-ADT
solvent: mesitylene

TABLE 1

| Material | Spread width in vertical direction (μm) | | | | Spread width in horizontal direction (μm) | | | |
|---|---|---|---|---|---|---|---|---|
| | Measurements | | | Average | Measurements | | | Average |
| | 1st | 2nd | 3rd | | 1st | 2nd | 3rd | |
| Cu | 129 | 144 | 135 | 136 | 834 | 849 | 884 | 856 |
| Au | 611 | 576 | 557 | 581 | 965 | 958 | 981 | 981 |
| ITO | 593 | 588 | 608 | 596 | 1,019 | 1,001 | 1,035 | 1,035 |
| IGZO | 540 | 530 | 523 | 531 | 930 | 925 | 980 | 980 |

As shown in Table 1 and FIGS. 21 to 24, the spread widths of the organic semiconductor ink in the vertical and horizontal directions on Cu were significantly smaller than those on other conductive materials (Au, ITO, and IGZO). Specifically, whereas the spread width in the horizontal direction on any conductive material was roughly proportional to the length of the drawn line, the spread width in the vertical direction on Cu was about ¼ or less those on other conductive materials. These results demonstrate that Cu has a lower wettability to the organic semiconductor ink than other conductive materials and is therefore the most preferred material for the partitions 12.

REFERENCE SIGNS LIST

1: active device
2: substrate
3: first conductive layer
4: second conductive layer
5: first electrode
5A: lower first electrode
5B: upper first electrode
6: second electrode
6A: lower second electrode
6B: upper second electrode
9: organic semiconductor layer
10: insulating layer
11: third electrode
12, 12A, 12B: partition
13: lower partition
14: upper partition
20a, 20b, 20c, 20d: mask layer

The invention claimed is:
1. An active device comprising:
a substrate;
first and second electrodes formed adjacent to each other on one main surface of the substrate;
an organic semiconductor layer formed on the one main surface of the substrate at least over a region between the first and second electrodes; and
a partition formed on the one main surface of the substrate in a region that is located outside the organic semicon- ductor layer in a planar direction and that is different from regions where the first and second electrodes are formed, wherein the partition comprises a conductive material.

2. The active device according to claim 1, wherein the partition comprises a plurality of partitions, and the organic semiconductor layer is formed between one partition and another partition.

3. The active device according to claim 2, wherein one side of the first electrode is located opposite one side of the second electrode, the one partition is located opposite the other partition, and a direction in which the one side of the first electrode is located opposite the one side of the second electrode is perpendicular to a direction in which the one partition is located opposite the other partition.

4. The active device according to claim 1, wherein the conductive material for the partition is Cu.

5. The active device according to claim 1, further comprising:

an insulating layer formed on the organic semiconductor layer; and a third electrode formed on the insulating layer, wherein the partition has a lower wettability than the substrate.

6. The active device according to claim 1, further comprising:

a third electrode formed on the one main surface of the substrate; and an insulating layer formed on the third electrode, wherein the first and second electrodes and the organic semiconductor layer are formed on the insulating layer, and the partition has a lower wettability than the insulating layer.

7. The active device according to claim 1, further comprising a third electrode formed on another main surface of the substrate, wherein the partition has a lower wettability than the substrate.

8. The active device according to claim 1, wherein the partition has a lower wettability than the first and second electrodes.

9. The active device according to claim 1, wherein the first electrode comprises a lower first electrode formed on the one main surface of the substrate and an upper first electrode formed on the lower first electrode, the second electrode comprises a lower second electrode formed on the one main surface of the substrate and an upper second electrode formed on the lower second electrode, the upper first electrode has a lower wettability than the lower first electrode, and the upper second electrode has a lower wettability than the lower second electrode.

10. The active device according to claim 1, wherein the partition is formed to be higher in a thickness direction of the substrate than at least a portion of the first and second electrodes.

11. A method for manufacturing an active device, comprising the steps of:

forming a first conductive layer on one main surface of a substrate;

forming a second conductive layer on the first conductive layer;

forming a mask layer on the second conductive layer;

contacting the first and second conductive layers with an etchant to remove a region of the first and second conductive layers that is not covered by the mask layer, thereby forming first and second electrodes adjacent to each other on the one main surface of the substrate and forming a partition on the one main surface of the substrate in a region that is different from regions where the first and second electrodes are formed and that is located outside a region between the first and second electrodes; and forming an organic semiconductor layer on the one main surface of the substrate at least over the region between the first and second electrodes such that the partition is located outside the organic semiconductor layer in a planar direction.

12. The method for manufacturing an active device according to claim 11, further comprising, before forming the organic semiconductor layer, the steps of:

stripping the mask layer from the first and second electrodes and the partition;

forming another mask layer on at least a portion of the second conductive layer that forms the partition; and contacting the first and second electrodes with another etchant to remove a region of the second conductive layer that is not covered by the other mask layer, thereby exposing at least a portion of the first and second electrodes.

13. The method for manufacturing an active device according to claim 11, wherein a material for the first conductive layer is ITO, and a material for the second conductive layer is Cu.

* * * * *